(12) United States Patent
Micallef

(10) Patent No.: US 7,755,257 B2
(45) Date of Patent: Jul. 13, 2010

(54) PIEZOELECTRIC ULTRACAPACITOR

(76) Inventor: Joseph A. Micallef, 5512 Montgomery St., Chevy Chase, MD (US) 20815

( * ) Notice: Subject to any disclaimer, the term of this patent is extended or adjusted under 35 U.S.C. 154(b) by 64 days.

(21) Appl. No.: 11/849,326

(22) Filed: Sep. 3, 2007

(65) Prior Publication Data
US 2009/0058223 A1 Mar. 5, 2009

(51) Int. Cl.
*H01L 41/08* (2006.01)
(52) U.S. Cl. .................. 310/339; 310/328; 310/311; 361/502; 361/503; 320/167
(58) Field of Classification Search ............ 310/311, 310/328, 800, 339; 361/502–503; 320/167
See application file for complete search history.

(56) References Cited

U.S. PATENT DOCUMENTS

| | | | | |
|---|---|---|---|---|
| 4,734,611 A | * | 3/1988 | Granz | 310/324 |
| 5,378,551 A | * | 1/1995 | Meadows et al. | 429/66 |
| 6,181,545 B1 | | 1/2001 | Amatucci et al. | |
| 7,050,291 B2 | | 5/2006 | Narendra et al. | |
| 2001/0021097 A1 | * | 9/2001 | Ohya et al. | 361/502 |
| 2008/0316677 A1 | * | 12/2008 | Gunderman et al. | 361/502 |
| 2009/0121585 A1 | * | 5/2009 | Lee et al. | 310/319 |
| 2009/0168305 A1 | * | 7/2009 | Fleig et al. | 361/528 |
| 2009/0305141 A1 | * | 12/2009 | Lee et al. | 429/232 |

OTHER PUBLICATIONS

Niezrecki, Piezoelectric Actuation: State of The Art, Shock and Vibration Digest, vol. 33, No. 4, Jul. 2001, 269-280.
Golden et al, Preparation of Propylene Carbonate Acrylate . . . , Macromolecules, 1995, 28, 3468-70.
Ishikawa et al, PVdF-HFP Gel Electrolytes . . . , publication unknown.

* cited by examiner

*Primary Examiner*—J. SanMartin

(57) ABSTRACT

Piezoelectric ultracapacitor is disclosed capable of converting the kinetic energy of ordinary motion into an electrical potential. The piezoelectric ultracapacitor of the present invention may be used in various contexts, including power generation, switching and control and memory.

19 Claims, 6 Drawing Sheets

PIEZOELECTRIC ULTRACAPACITOR

BACKGROUND OF THE INVENTION

The generation of energy is a substantial concern to governments, individuals and research bodies around the world because of the difficulty in securing sufficient fuels to meet rising energy demand and the many environmental hazards associated with the generation of power and the acquisition of fuels stocks. One need only consider the Middle East or the tailpipe of an automobile to begin to appreciate the problems involved with the current approach to energy generation.

Many have attempted to develop acceptable alternatives to fossil or nuclear fuels, with limited success. Solar, wave and wind energy systems, for example, provide mechanisms by which electrical energy can be generated without the use of fossil fuels, but they suffer from being subject to the variability of the weather and also are only economically marginal as a replacement to fossil fuels. Similarly, techniques for making fuel from renewable biological sources, such as ethanol from corn or sugar cane, have been developed, but present difficulties of their own, including the diversion of agricultural land from food production and relatively limited energy production.

Fusion, of course, is yet another energy generation technique that holds great promise, but that promise is far in the future and is unlikely to be realized in a practical way for many decades, if ever.

What would be ideal, and is needed, is an energy generation technology employing an abundant input, providing potentially significant energy output, avoiding environmental hazards and which is readily deployable.

SUMMARY OF THE INVENTION

These and other needs are satisfied by the present invention, which employs a piezoelectric ultracapacitor to harness efficiently the energy in physical motion, such as walking, driving or vibrating. A piezoelectric element continuously creates a potential difference in response to physical forces exerted on it, including forces exerted by the ordinary vibrations of everyday life. The potential difference causes charge to accumulate on an ultracapacitive structure, which charge is prevented from returning to the piezoelectric by one or more semiconductive devices.

While some have attempted in the past to use piezoelectrics for energy generation, it is well-known that piezoelectric materials create voltages of very limited duration and extremely small currents, thereby limiting their ability to generate electric power. Ultracapacitors, of course, have also been known and used in various contexts for energy storage, but not, to the inventor's knowledge, for energy generation purposes. The combination of piezoelectric and ultracapacitor technologies, such as in the manner described herein, provides not only potential differences of extended duration, but also unexpectedly exhibits the ability to regenerate the charge captured on the ultracapacitive structure even after that charge has been drained away for other purposes. The present invention thus provides a constant voltage source without the use of fossil fuels, or any of the other disadvantages associated with the technologies described above. Such a voltage can be used for power generation, control and other purposes as will become apparent to those of ordinary skill in the art in view of the disclosures below.

DETAILED DESCRIPTION

Figure 1:
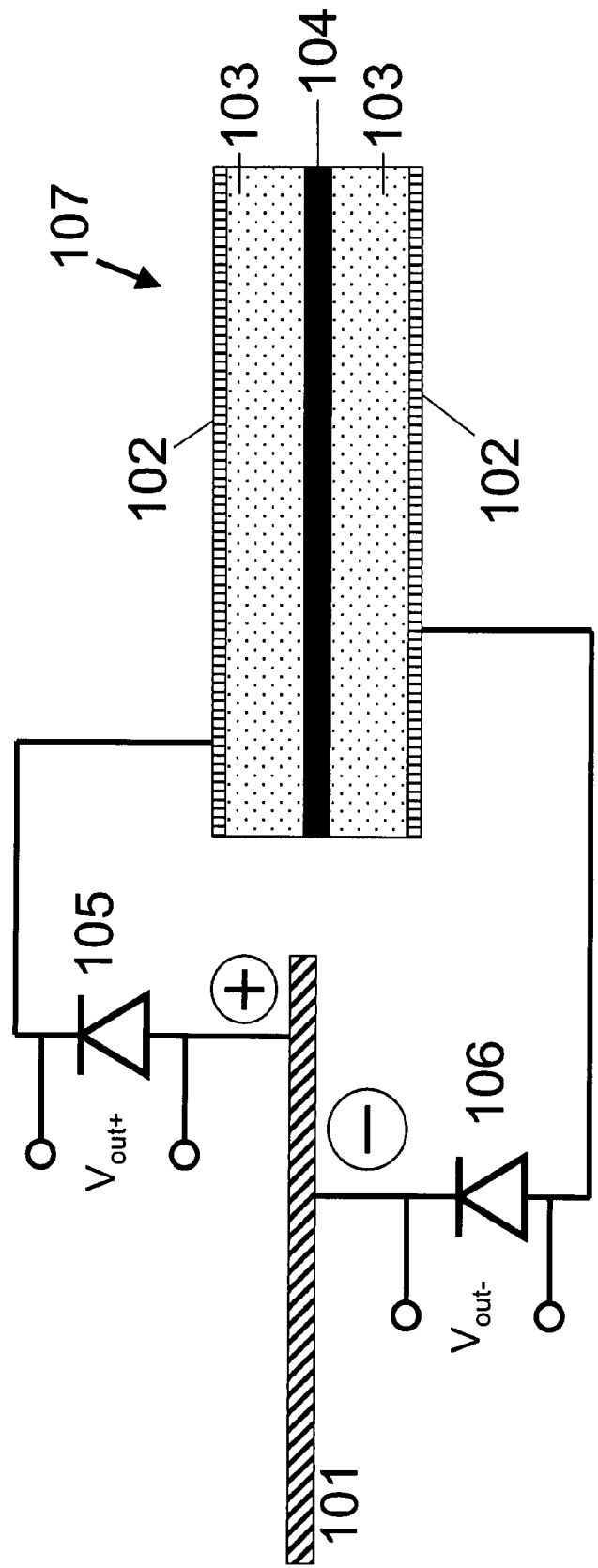
FIG. 1 depicts a first embodiment of a piezoelectric ultracapacitor employing the principles of the invention.

Referring to FIG. 1, piezoelectric element 101 is coupled to ultracapacitor 107 through diodes 105 and 106. Piezoelectric element 101 can be formed of one or more portions of one or more suitable piezoelectric material, such as polyvinylidene difluoride (known as "PVDF") or flexible lead zirconate titanate (often referred to as "PZT"). The invention is not limited to the use of these materials, though it is believed that the flexible nature of these two piezoelectric materials provides some protection from cracking or other damage during use. Flexible piezoelectric materials are therefore preferred.

Moreover, experiments have unexpectedly shown that the power generation capability of the present invention is not greatly enhanced by the use of PZT (which is inherently capable of creating higher voltages than PVDF); PVDF is therefore preferred due to its lower cost. Such materials are known and commercially available from many different sources. PVDF, for example, is available commercially under the trade names KYNAR® and KYNAR FLEX® by Arkema, Inc. of Philadelphia, Pa.

In this and other embodiments that follow diodes are described as coupling the piezoelectric element to electrodes of the ultracapacitor. However, other coupling mechanisms, such as FET or BJT transistors, can be employed. Indeed, in many applications the use of transistors instead of diodes may be preferred because of the switching capability they provide.

Ultracapacitor 107 is formed from electrodes 102, formed for example from aluminum; electrolyte materials 103, such as cotton cloth or other material impregnated with an electrolytic solution (a solution of sodium chloride in water, for example); and barrier 104, which can be a proton conductor such as Nafion, a commercially available proton conductive membrane manufactured by the DuPont Company of Wilmington, Del. and distributed by Ion Power, Inc. of New Castle, Del. Ultracapacitors have been known for some time, and appear to have been invented at the General Electric Company in the late 1950's. See, for example, U.S. Pat. No. 2,800,616, the entirety of which is hereby incorporated by reference. The principles of their operation are therefore well-known to the art and will not be further explained here.

It should be noted, however, that modern ultracapacitors often employ a proton conductive barrier, such as the aforementioned NAFION®, but such a barrier is not necessary to the formation of an ultracapacitor. It has been found that such a barrier is not necessary for implementation of the present invention either and indeed adds only a small amount of added efficiency. Thus, while some of the embodiments of the invention are here described as including such a barrier/membrane, it should be recognized that such a barrier is not a requirement of the invention except where specifically and expressly called for by the claims appended hereto.

Referring again to FIG. 1, in operation, forces exerted on the piezoelectric element 101, from vibrations or other movements, induce a voltage across the surfaces of element 101, which is applied to the ultracapacitor through the coupling shown. Such voltages can be substantial though, as noted above, the current created by piezoelectric materials is quite small, due to the extremely high input impedance of the piezoelectric material and the fleeting nature of the potential differences. Nevertheless, the voltage causes a charge to accumulate on the electrodes of the ultracapacitor, charge that is prevented from returning to the piezoelectric element by diodes 105 and 106.

Charge accumulated on the electrodes 102 of the ultracapacitor cause an opposite charge to accumulate at the interface of the electrolytic materials and the electrodes. Charge carriers in an electrolyte are ions, not electrons, so they are incapable of traveling through the metal structure of the electrodes. Instead, the interface between the electrode and the electrolyte, on each side of the ultracapacitor 107 (i.e., the bottom and top as shown in the figure) acts as a highly dense capacitor capable of storing a very large amount of energy and providing to relatively stable potential difference, designated as $V_{out}$. Output nodes are shown across each of the diodes 105 and 106, across which $V_{out+}$ and $V_{out-}$, respectively, can be obtained.

Either of these output voltages can be coupled to a power consumption device. For example, the energy stored in the ultracapacitive structures can be drained off, to be stored in another circuit element, such as a battery or capacitor. Alternatively, either output voltage may also be used as a control voltage, such as in a logic circuit, or for purposes of performing some work in an electrical, chemical or mechanical device, such as a solar cell, a fuel cell or an alarm, respectively.

Figure 2:
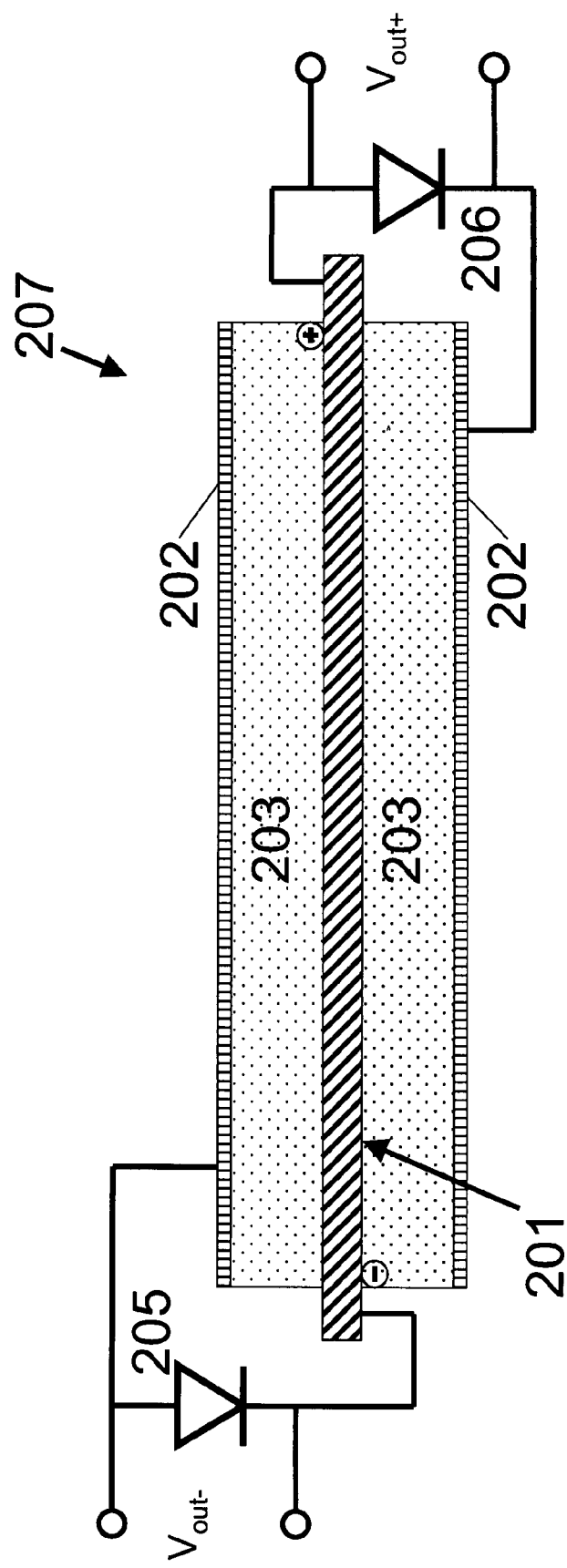
FIG. 2 depicts a second embodiment of a piezoelectric ultracapacitor employing the principles of the invention.

Referring now to FIG. 2, there is shown a second embodiment, 207, of a piezoelectric ultracapacitor employing the principles of the invention. There, piezoelectric element 201 forms the center barrier of piezoelectric ultracapacitor 207, and is coupled to electrodes 202 through diodes 205 and 206. Electrodes 202 are similar to electrodes 102 described in connection with FIG. 1. Electrolyte materials 203, which separate piezoelectric element 201 from electrodes 202, are also similar to electrolyte materials 103 described in connection with FIG. 1.

The positive and negative faces of the element 201 are indicated in the figure (as they are in the other figures as well). Those of ordinary skill in the art will understand that the proper coupling of diodes 205 and 206 depends on which face of the piezoelectric element the diode is being coupled to. Thus, diode 205 is coupled to the negative face of piezoelectric 201 through its cathode and diode 206 is coupled to the positive face of the piezoelectric through its anode. Similar couplings are depicted in each of the figures.

The operation of the embodiment shown in FIG. 2 is also similar to the operation of the embodiment shown in FIG. 1, though with some differences. More specifically, forces exerted on piezoelectric ultracapacitor 207, and thereby on piezoelectric element 201, induce a voltage across the surfaces of element 201, which voltage is applied to the electrodes 202 through the coupling shown, including diodes 205 and 206. The voltage causes a charge to accumulate on the electrodes of the ultracapacitor, charge that is prevented from returning to the piezoelectric element by diodes 205 and 206. As with the embodiment of FIG. 1, charge accumulated on the electrodes 202 of the ultracapacitor 207 causes an opposite charge to accumulate in the electrolytic materials at the interface of those materials with the electrodes, thereby again causing each interface to become a very dense capacitor.

Figure 3:
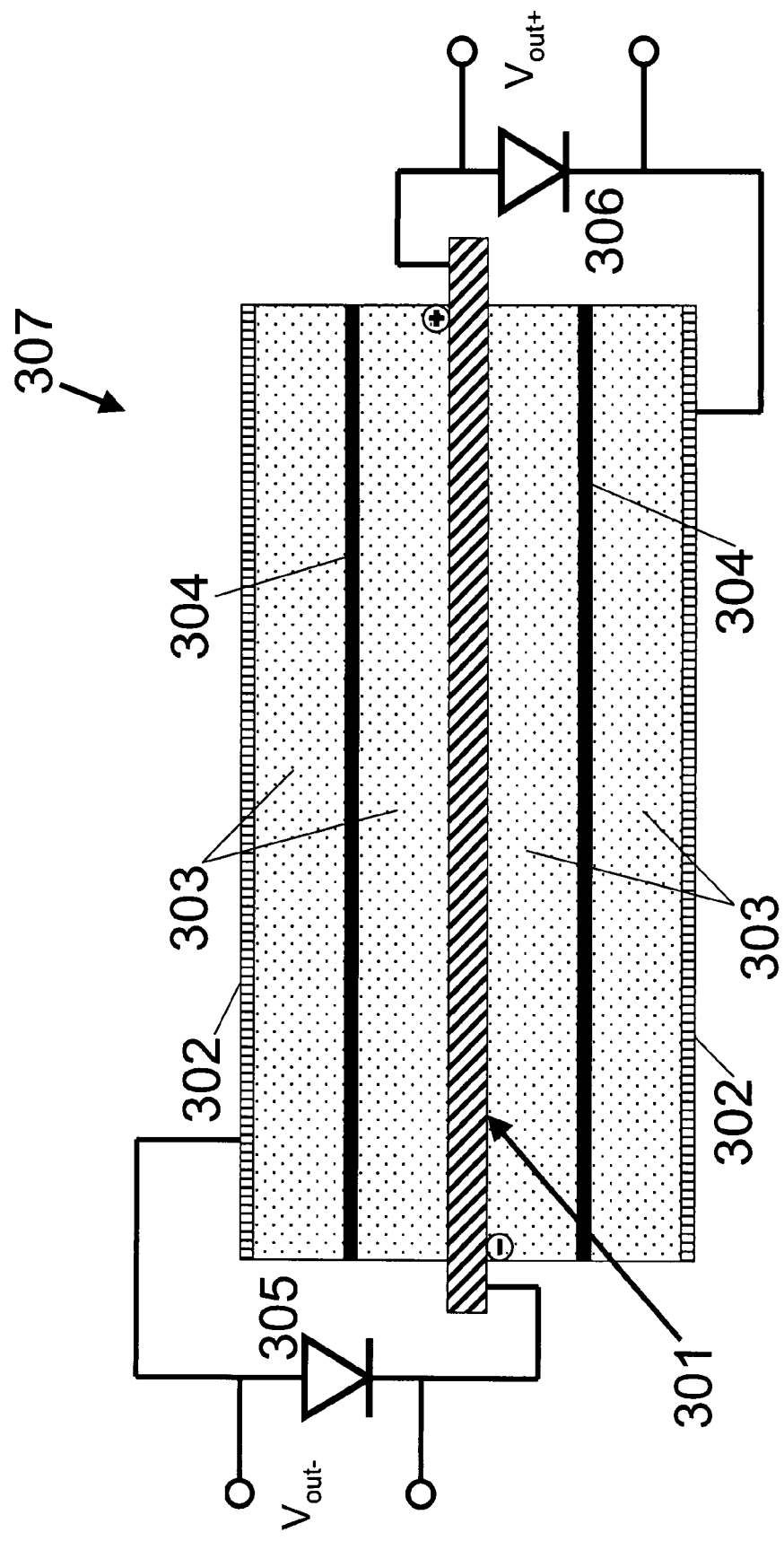
FIG. 3 depicts a third embodiment of a piezoelectric ultracapacitor employing the principles of the invention.

FIG. 3 depicts yet another embodiment of the invention, here configured as a two-sided ultracapacitor. Specifically, there is shown piezoelectric ultracapacitor 307 having piezoelectric element 301 that forms the center barrier of piezoelectric ultracapacitor 307, and is coupled to electrodes 302 through diodes 305 and 306. Electrodes 302 are similar to electrodes 102 described in connection with FIG. 1. Electrolyte materials 303, which separate piezoelectric element 301 from electrodes 302, are also similar to electrolyte materials 103 described in connection with FIG. 1. Here, however, electrolyte materials 303 each comprise two electrolytic sub-materials separated by proton conductive membrane 304 to provide further separation of negative and positive ions in the electrolyte.

Figure 3A:
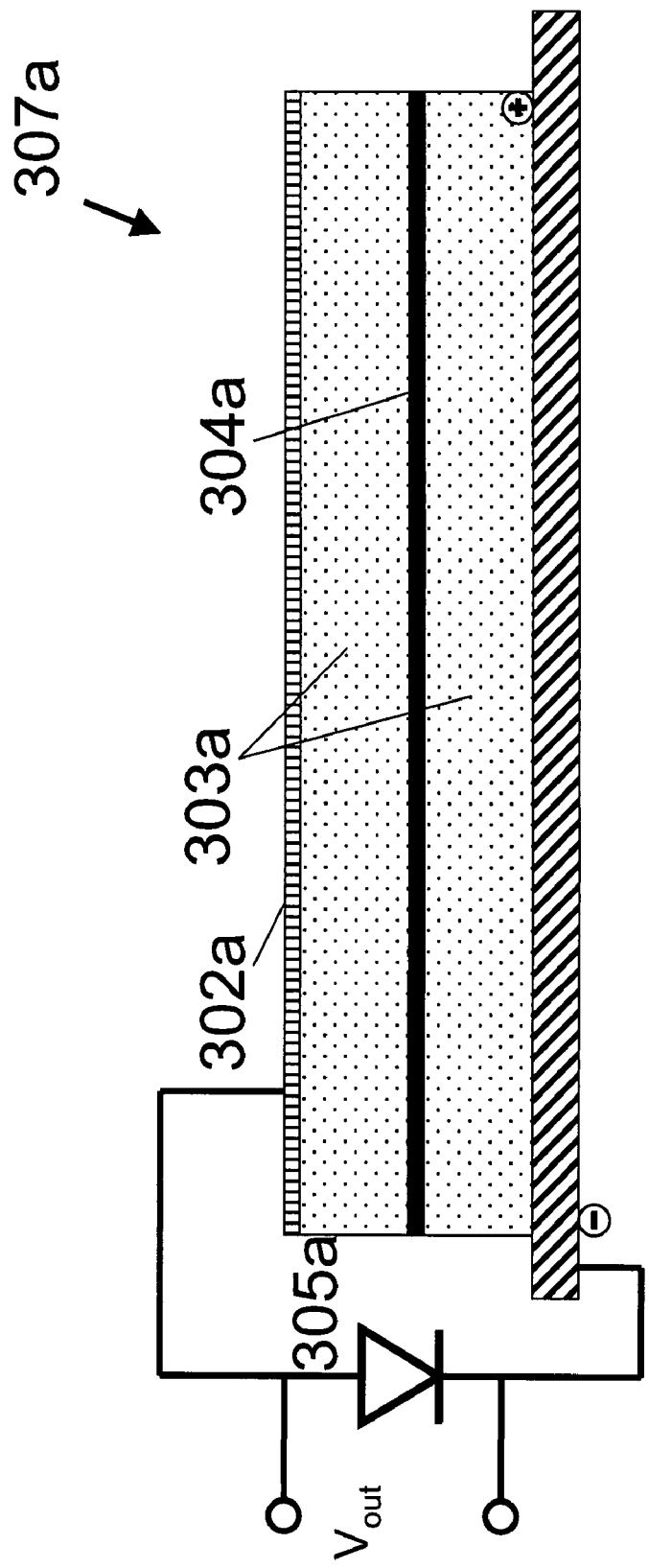
FIG. 3a depicts a modification of the embodiment of a piezoelectric ultracapacitor shown in FIG. 3.

It should be noted that the invention does not require formation of a two-sided ultracapacitor as shown in these figures. A one-sided ultracapacitor—for example, one including only the top half of FIG. 3—would also be encompassed by the invention. Such an embodiment is shown in FIG. 3a, and those of ordinary skill in the art will readily understand how to make and use a one-side ultracapacitor in the context of the other embodiments described herein.

Figure 4:
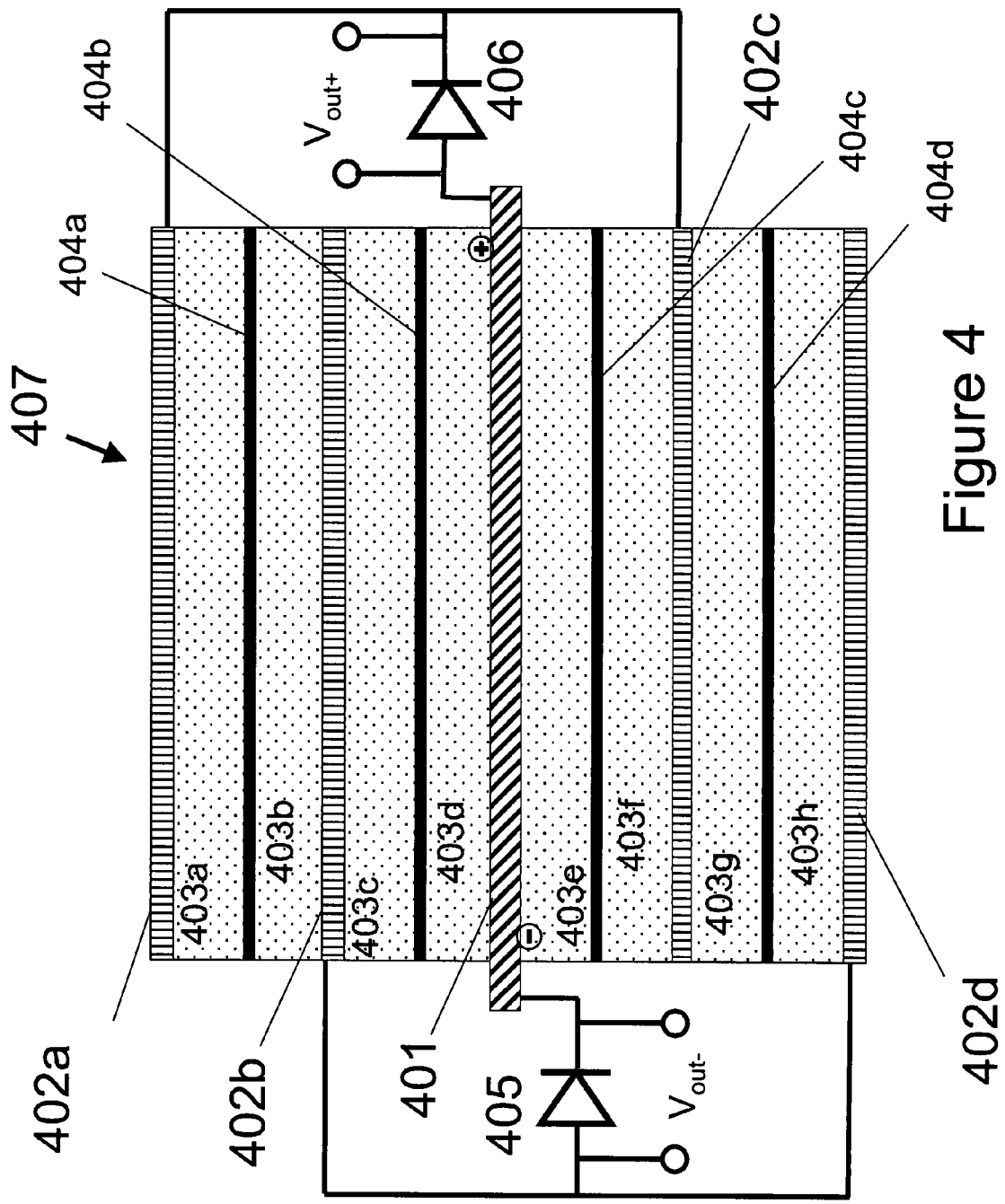
FIG. 4 depicts a fourth embodiment of a piezoelectric ultracapacitor employing the principles of the invention.

FIG. 4 depicts yet another embodiment, which is a modification of the embodiment shown in FIG. 3. Here, multiple ultracapacitive layers are formed above and below each face of the piezoelectric element. The piezoelectric ultracapacitive stack of this embodiment includes multiple electrolytic sub-layers (403a-h), multiple electrode sub-layers (402a-d) and multiple proton conductive sub-layers (404a-d). The same materials described above may be employed for these sub-layers. Sub-layers 402a and 402c are coupled together and to the cathode of a diode 406, and thereby to the positive face of piezoelectric element 401. Layers 402b and 402d are coupled together and to the anode of another diode 405, and thereby to the negative face of piezoelectric element 401.

Note that in such an embodiment diodes 405 and 406 are each coupled to multiple electrode layers in the stack. It is, of course, possible to employ multiple semiconductive elements coupled to each face of the piezoelectric—one per electrode for example. However, where the combined maximum voltage created on all electrodes coupled to a single face of the piezoelectric is less than the breakdown voltage of the diode, it is more efficient to employ just a single diode per piezoelectric face, as shown.

Figure 5:
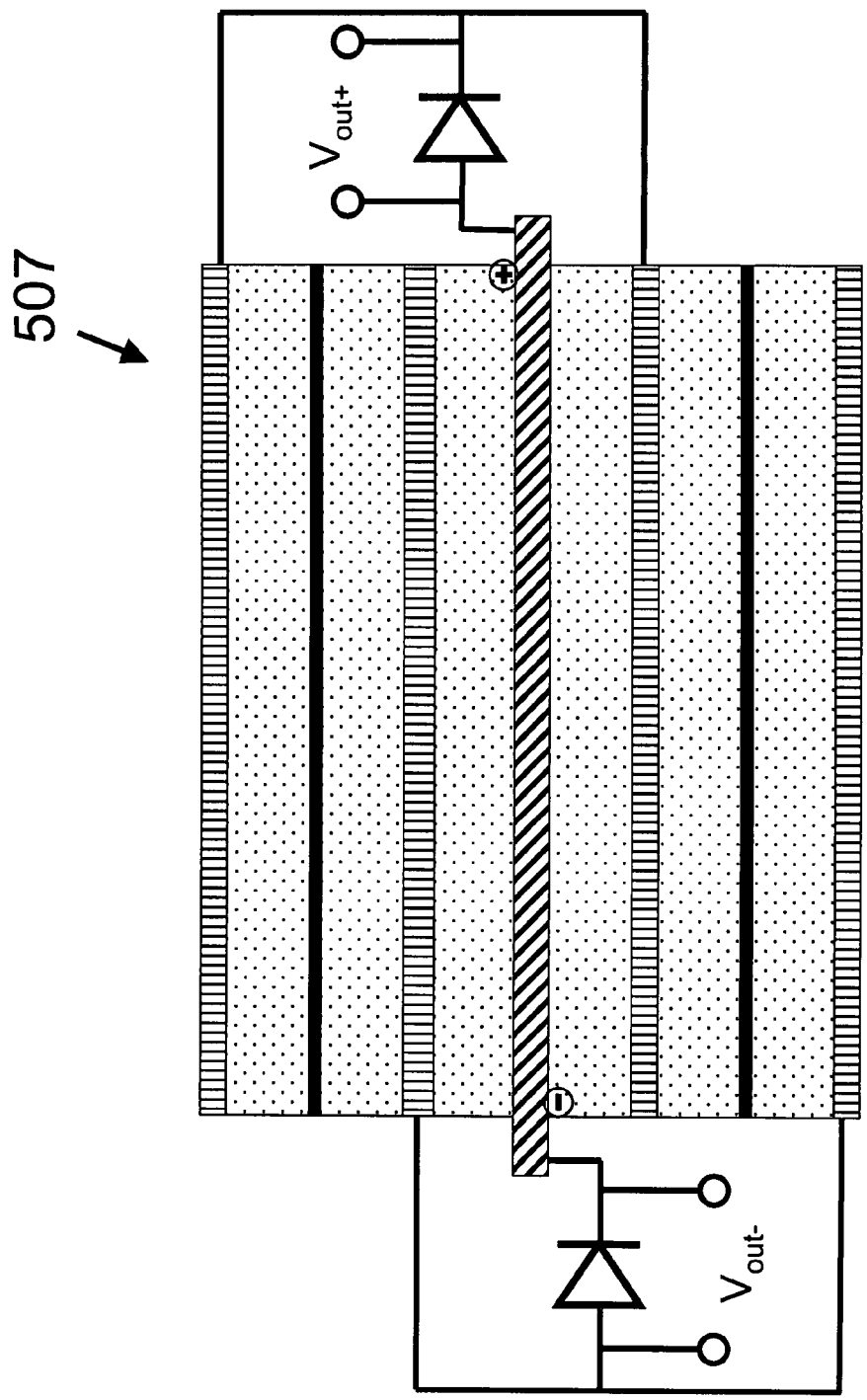
FIG. 5 depicts a fifth embodiment of a piezoelectric ultracapacitor employing the principles of the invention.

FIG. 5 depicts an embodiment similar to that of FIG. 4, but here the proton conductive layer is not included in the capacitive layers immediately adjacent to the piezoelectric element. Of course, the proton conductive layer could have been left out of the outer capacitive layers as well.

One important benefit of the structures described above is their ability to recharge themselves. Taking the structure of FIG. 2 as an example, once piezoelectric ultracapacitor 207 is charged to a maximum, that charge may be drained, as mentioned above, either to some energy storage mechanism, such as a battery or capacitor, or to perform some work. However, once drained the charge across each diode 205 and 206 returns, over the course of several seconds, without further intentional excitation or the connection of some other power source. The piezoelectric element is constantly creating continually varying voltages due to the normal—though usually unnoticed—vibrations and other forces of ordinary life. Those voltages, though relatively small, induce concomitant charge accumulations on electrodes 202 and, due to the semiconductive properties of diode 205 and 206, eventually charge the piezoelectric ultracapacitor 207 to a maximum level. In experiments using an embodiment that employed aluminum electrodes, cotton cloth impregnated with a sodium chloride solution for the electrolyte 203 and a PZT element at the core, it was observed that recharging of each side of the piezoelectric ultracapacitor to about 0.3V occurred in about 3 seconds. A similar capability was observed in an embodiment similar to that of FIG. 2 and employing a PVDF core.

The embodiments described above are, of course, exemplary and not intended to limit the scope of the claims beyond that which is specifically and expressly stated in the claims.

I claim:

1. A piezoelectric device, comprising:
   a piezoelectric element having at least a first surface and a second surface, said first surface coupled to a first electrolyte layer, said first electrolyte layer coupled to a first electrode, and said second surface of said piezoelectric element coupled by an electrical connection to said first electrode.

2. The piezoelectric device of claim 1 wherein said second surface of said piezoelectric element is coupled to a second electrolyte layer, and said second electrolyte layer is coupled to a second electrode.

3. The piezoelectric device of claim 2 wherein said electrical connection includes a first semi-conductive device and wherein said first surface is coupled to said second electrode via a second semi-conductive device.

4. The piezoelectric device of claim 1 wherein said first electrolyte layer includes a first proton conductive membrane.

5. The piezoelectric device of claim 1 wherein said piezoelectric element is comprised of at least one flexible piezoelectric layer.

6. The piezoelectric device of claim 1 wherein said electrical connection includes a first semi-conductive device.

7. An ultracapacitive piezoelectric device, comprising:
   a piezoelectric element having at least a first face and a second face,
   a first electrode, in contact with a first electrolyte layer and opposite said first face of said piezoelectric element,
   a second electrode, in contact with a second electrolyte layer and opposite said second face of said piezoelectric element, and
   wherein said first face of said piezoelectric element is coupled to said second electrode by an electrical connection.

8. The device of claim 7 wherein said piezoelectric element is comprised of at least one flexible piezoelectric material.

9. The device of claim 7 wherein said electrical connection includes a means for connecting.

10. The device of claim 9 wherein said means for connecting includes at least a first semi-conductive device.

11. The device of claim 7 wherein said first electrolyte layer includes a liquid electrolyte.

12. The device of claim 7 wherein said first electrolyte layer is a liquid electrolyte.

13. An ultracapacitive piezoelectric device, comprising:
    a piezoelectric layer having a first surface and a second surface,
    a first electrolyte layer coupled to a first electrode and said first surface,
    a second electrolyte layer coupled to a second electrode and said second surface, and
    wherein said first surface is coupled to said second electrode by an electrical connection.

14. The device of claim 13 wherein said piezoelectric element is comprised of at least one flexible piezoelectric material.

15. The device of claim 13 wherein said electrical connection includes a means for connecting.

16. The device of claim 15 wherein said means for connecting includes at least a first semi-conductive device.

17. The device of claim 13 wherein said first electrolyte layer includes a liquid electrolyte.

18. The device of claim 13 wherein said first electrolyte layer includes a first proton conductive membrane.

19. The device of claim 18 wherein said second electrolyte layer includes a second proton conductive membrane.

* * * * *